(12) United States Patent
Furuhashi et al.

(10) Patent No.: US 10,002,931 B2
(45) Date of Patent: Jun. 19, 2018

(54) SILICON CARBIDE SEMICONDUCTOR DEVICE

(71) Applicant: MITSUBISHI ELECTRIC CORPORATION, Chiyoda-ku (JP)

(72) Inventors: Masayuki Furuhashi, Tokyo (JP); Naruhisa Miura, Tokyo (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 363 days.

(21) Appl. No.: 14/908,411

(22) PCT Filed: Mar. 7, 2014

(86) PCT No.: PCT/JP2014/001262
§ 371 (c)(1),
(2) Date: Jan. 28, 2016

(87) PCT Pub. No.: WO2015/015672
PCT Pub. Date: Feb. 5, 2015

(65) Prior Publication Data
US 2016/0190261 A1    Jun. 30, 2016

(30) Foreign Application Priority Data
Jul. 31, 2013    (JP) .................................. 2013-159292

(51) Int. Cl.
*H01L 29/40*      (2006.01)
*H01L 21/04*      (2006.01)
(Continued)

(52) U.S. Cl.
CPC .......... *H01L 29/408* (2013.01); *H01L 21/049* (2013.01); *H01L 29/0634* (2013.01);
(Continued)

(58) Field of Classification Search
CPC ............... H01L 29/408; H01L 29/0634; H01L 29/1095; H01L 29/78; H01L 29/7802;
(Continued)

(56) References Cited

U.S. PATENT DOCUMENTS 7,338,869 B2 *    3/2008   Fukuda ................. H01L 21/049
                                                    257/E21.063
8,236,707 B2      8/2012   Kobayashi
(Continued)

FOREIGN PATENT DOCUMENTS

JP          11-31691 A        2/1999
JP        2005-39138 A        2/2005
(Continued)

OTHER PUBLICATIONS

English translation of the International Preliminary Report on Patentability and Written Opinion dated Feb. 2, 2016 in PCT/JP2014/001262 filed Mar. 7, 2014.
(Continued)

*Primary Examiner* — Alexander Sofocleous
*Assistant Examiner* — Sun M King
(74) *Attorney, Agent, or Firm* — Oblon, McClelland, Maier & Neustadt, L.L.P.

(57) ABSTRACT

A silicon carbide semiconductor device capable of effectively increasing a threshold voltage and a method for manufacturing the silicon carbide semiconductor device. The silicon carbide semiconductor device includes a gate insulating film formed on part of surfaces of the well regions and the source region; and a gate electrode formed on a surface of the gate insulating film so as to be opposite to an end portion of the source region and the well regions. Furthermore, the gate insulating film has, in an interface region between the well regions and the gate insulating film, defects that each form a first trap having an energy level
(Continued)

deeper than a conduction band end of silicon carbide and that include a bond between silicon and hydrogen.

17 Claims, 10 Drawing Sheets

(51) Int. Cl.
*H01L 29/51* (2006.01)
*H01L 29/16* (2006.01)
*H01L 29/66* (2006.01)
*H01L 29/739* (2006.01)
*H01L 29/78* (2006.01)
*H01L 29/06* (2006.01)
*H01L 29/10* (2006.01)

(52) U.S. Cl.
CPC ...... *H01L 29/1095* (2013.01); *H01L 29/1608* (2013.01); *H01L 29/51* (2013.01); *H01L 29/518* (2013.01); *H01L 29/66712* (2013.01); *H01L 29/7395* (2013.01); *H01L 29/78* (2013.01); *H01L 29/7802* (2013.01)

(58) Field of Classification Search
CPC .......... H01L 29/7395; H01L 29/66712; H01L 29/1608; H01L 29/518; H01L 29/51; H01L 21/049
See application file for complete search history.

(56) References Cited

U.S. PATENT DOCUMENTS

| | | | |
|---|---|---|---|
| 8,513,676 B2 | 8/2013 | Harada et al. | |
| 8,546,815 B2 | 10/2013 | Yano et al. | |
| 8,686,434 B2 * | 4/2014 | Harada | ................ H01L 21/324 257/627 |
| 2012/0252223 A1 | 10/2012 | Kobayashi | |

FOREIGN PATENT DOCUMENTS

| | | | |
|---|---|---|---|
| JP | 2005-277253 A | 10/2005 | |
| JP | 2006-269641 A | 10/2006 | |
| JP | 2011-91186 A | 5/2011 | |
| JP | 2011-176158 A | 9/2011 | |
| WO | 2011/074237 A1 | 6/2011 | |
| WO | 2011/118101 A1 | 9/2011 | |

OTHER PUBLICATIONS

K. Fukuda, et al., "Effect of oxidation method and post-oxidation annealing on interface properties of metal-oxide-semiconductor structures formed on n-type 4H-SiC C(0001) face," Applied Physics Letters, vol. 77, No. 6, Aug. 7, 2000, pp. 866-868.
Peter E. Blochl, "First-principles calculations of defects in oxygen-deficient silica exposed to hydrogen," Physical Review B, vol. 62, No. 10, Sep. 1, 2000, pp. 6158-6179.
S. M. Sze, "Physics of Semiconductor Devices," $2^{nd}$ Edition, Chapter 7, 1981, pp. 362-407.
Masato Noborio, et al., "Enhanced Channel Mobility in 4H-SiC MISFETs by Utilizing Deposited $SiN/SiO_2$ Stack Gate Structures," Materials Science Forum, vols. 600-603, 2009, pp. 679-682.
International Search Report dated Jun. 10, 2014 in PCT/JP2014/001262 filed Mar. 7, 2014.

* cited by examiner

F I G . 3A
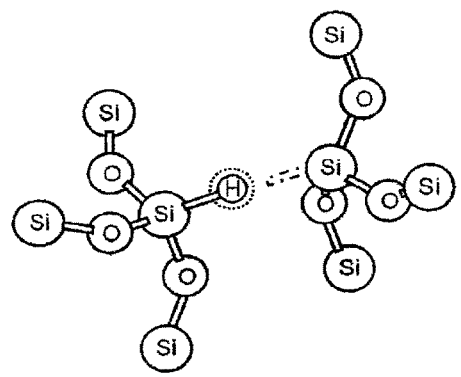
F I G . 3B
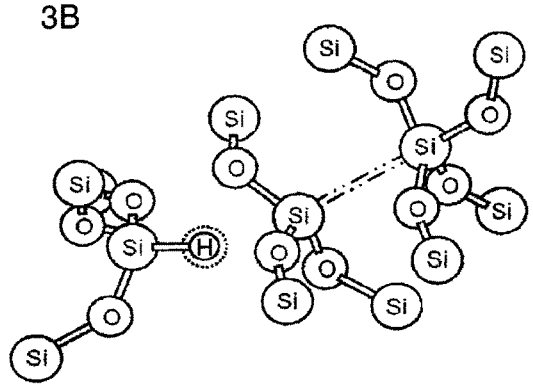
F I G . 4
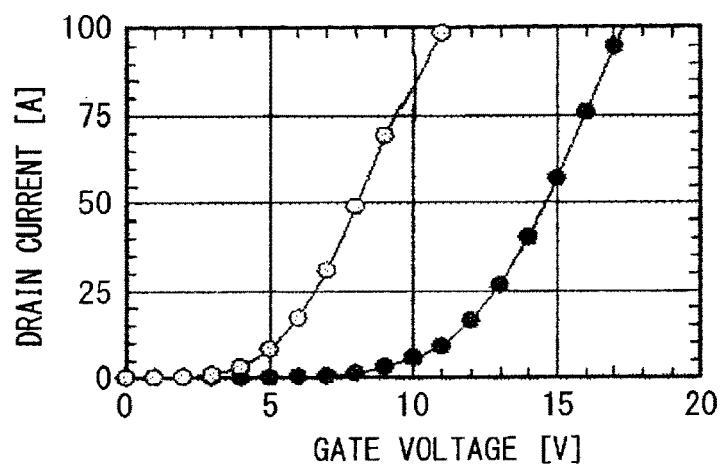

F I G. 2 1
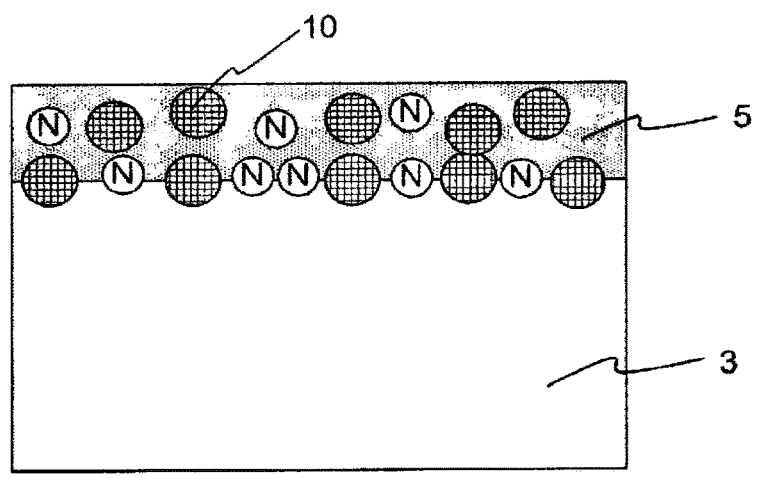
F I G. 2 2
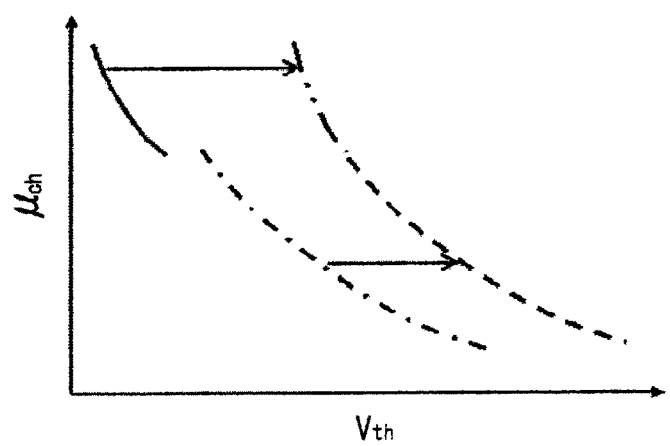

SILICON CARBIDE SEMICONDUCTOR DEVICE

TECHNICAL FIELD

The present invention relates to a silicon carbide semiconductor device.

BACKGROUND ART

Silicon carbide (SiC) is promising to be a next-generation semiconductor material that can achieve high-voltage, low-loss semiconductor devices. Particularly promising semiconductor devices including silicon carbide are insulated gate semiconductor devices such as metal-oxide-semiconductor field effect transistors (MOSFETs) and insulated gate bipolar transistors (IGBTs) that enable switching operations. The insulated gate semiconductor devices need to have characteristics, namely, normally-off characteristics in which no current passes when voltage is not applied to a gate.

To be used as the semiconductor devices having the normally-off characteristics, semiconductor devices need to have a high threshold voltage ($V_{th}$) to some extent, the threshold voltage being a gate voltage when ON-state current starts to flow. For example, IGBTs, which are commonly and commercially available and include silicon (Si), have a typical threshold voltage of 5 V. A high threshold voltage of at least several electron volts or greater is needed in such manner in consideration of a malfunction and an operation at high temperature.

The threshold voltage is greatly influenced by a fixed charge in a gate insulating film and interface traps at a so-called MOS interface between silicon carbide and the gate insulating film. When silicon carbide is used in comparison with silicon (Si) typically used as a material for conventional semiconductor devices, more interface traps occurring at the MOS interface and poor quality of the MOS interface have been known.

Many interface traps having an energy level of 0.2 eV or shallower from a conduction band end of silicon carbide are at the MOS interface in which a channel is formed during ON operations, thereby increasing an ON resistance, namely, an ON-state loss due to a decrease in a channel conductance (channel mobility). Thus, a reduction of the interface traps has been actively developed. For example, a technique for reducing interface traps at an MOS interface by a heat treatment in a hydrogen ($H_2$) gas (hydrogen annealing), a heat treatment in a nitrogen monoxide (NO) gas or a dinitrogen monoxide ($N_2O$) gas (nitrogen annealing), and a heat treatment in a phosphorus oxychloride ($POCl_3$) gas ($POCl_3$ annealing), and a technique for increasing channel mobility are disclosed (see Patent Document 1, for example).

PRIOR ART DOCUMENT

Patent Document

Patent Document 1: International Patent Publication No. WO2011/074237

SUMMARY OF INVENTION

Problems to be Solved by the Invention

When the interface traps at the MOS interface are reduced, the channel mobility increases and the threshold voltage decreases at the same time. In other words, the increase of the channel mobility and the increase of the threshold voltage have the trade-off relationship therebetween. When the threshold voltage is highly maintained, the channel mobility is low, and when the channel mobility is high, the threshold voltage is low, which results in normally-on characteristics. In other words, if the interface traps are reduced to increase the channel mobility, the threshold voltage decreases, and normally-off characteristics can be hardly obtained.

The present invention has been made in view of the above mentioned problems, and an object thereof is to provide a silicon carbide semiconductor device capable of improving a trade-off relationship between channel mobility and a threshold voltage and achieving normally-off characteristics.

Means to Solve the Problems

A silicon carbide semiconductor device according to the present invention includes: a drift layer of a first conductivity type formed on a surface of a silicon carbide substrate; a plurality of well regions of a second conductivity type formed at an interval in a surface layer portion of the drift layer; a source region of the first conductivity type formed in part of a surface layer portion of the well regions; a gate insulating film formed on surfaces of the well regions and the source region; and a gate electrode formed on a surface of the gate insulating film so as to be opposite to an end portion of the source region and the well regions. A coefficient X [eV] in which an energy level of interface traps is in a range of 0.1 eV to 0.4 eV is 0.09 eV or more and 0.13 eV or less in Math 1, assuming that a density of the interface traps formed in an interface region between the gate insulating film and the well regions is $D_{it}$ [cm$^{-2}$eV$^{-1}$], an energy level of the interface traps at a depth from an energy level $E_c$ of a conduction band of silicon carbide is ($E_c$–E) [eV], an asymptotic value of a density $D_{it}$ of the interface traps having an energy level of ∞ [eV] is a coefficient A [cm$^{-2}$eV$^{-1}$], a coefficient B [cm$^{-2}$eV$^{-1}$] is a value in which a density $D_{it}$ of the interface traps having an energy level of 0 [eV] is equal to (A+B) [cm$^{-2}$eV$^{-1}$], and X [eV] is a coefficient. A ratio R is 0.54 or more and 0.67 or less in Math 2, assuming that a density of the interface traps when an energy level of the interface traps is 0.1 eV is a reference value $D_{it}1$ [cm$^{-2}$eV$^{-1}$], a difference between a density of the interface traps when an energy level of the interface traps is 0.2 eV and $D_{it}1$ [cm$^{-2}$eV$^{-1}$] is $D_{it}2$ [cm$^{-2}$eV$^{-1}$], a difference between a density of the interface traps when an energy level of the interface traps is 0.8 eV and $D_{it}1$ [cm$^{-2}$eV$^{-1}$] is $D_{it}8$ [cm$^{-2}$eV$^{-1}$], and a ratio of $D_{it}2$ [cm$^{-2}$eV$^{-1}$] to $D_{it}8$ [cm$^{-2}$eV$^{-1}$] is the ratio R.

$$D_{it}(E) = A + B\exp\left(-\frac{E_c - E}{X}\right) \quad \text{[Math 1]}$$

$$R = \frac{D_{it}2}{D_{it}8} \quad \text{[Math 2]}$$

Effects of the Invention

The silicon carbide semiconductor device of the present invention can suppress the decrease in the channel mobility and effectively increase the threshold voltage. In other words, the trade-off relationship between the channel mobility and the threshold voltage can be improved.

BRIEF DESCRIPTION OF DRAWINGS

FIG. 3 is a schematic diagram of defects including a bond between silicon and hydrogen included in the silicon carbide semiconductor device in the first embodiment of the present invention.

FIG. 4 is a diagram showing gate characteristics of the silicon carbide semiconductor device in the first embodiment of the present invention.

FIG. 21 is an enlarged schematic cross-sectional view around a MOS interface of a silicon carbide semiconductor device in a second embodiment of the present invention.

FIG. 22 is a schematic diagram showing a relationship between channel mobility and a threshold voltage of the silicon carbide semiconductor device in the second embodiment of the present invention.

DESCRIPTION OF EMBODIMENTS

First Embodiment

Figure 1:
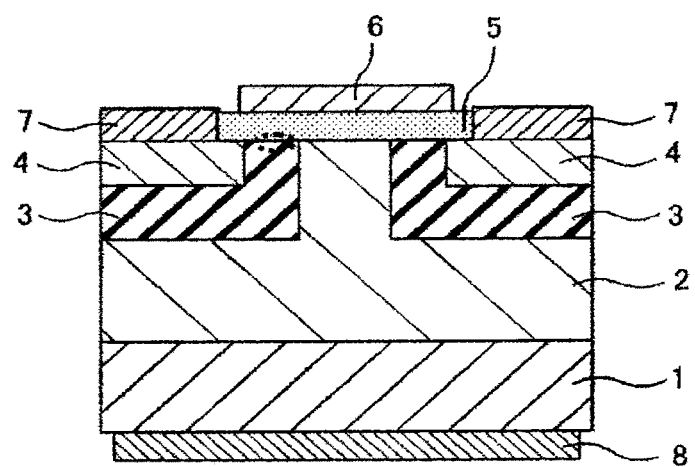
FIG. 1 is a cross-sectional view showing a silicon carbide semiconductor device in a first embodiment of the present invention.

First, an element structure of a silicon carbide semiconductor device in a first embodiment of the present invention is described. FIG. 1 is a cross-sectional view showing the silicon carbide semiconductor device in the first embodiment of the present invention. In this embodiment, an n-channel silicon carbide MOSFET is described as an example of the silicon carbide semiconductor device.

As shown in FIG. 1, a drift layer 2 of a first conductivity type is formed on a surface being a first main surface of a silicon carbide substrate 1 of the first conductivity type, and two well regions 3 of a second conductivity type are provided at an interval in a surface layer portion of the drift layer 2. Source regions 4 of the first conductivity type are formed in part of a surface layer portion of the well region 3, and a gate insulating film 5 is formed on part of surfaces of the well regions 3 and the source regions 4. A gate electrode 6 is formed on a surface of the gate insulating film 5 so as to be opposite to end portions of the source regions 4 and the well regions 3. A source electrode 7 is formed on the surface of the source regions 4, and a drain electrode 8 is formed on a back surface being a second main surface of the silicon carbide substrate 1.

In this embodiment, the n-channel silicon carbide MOSFET in which the first conductivity type is an n type and the second conductivity type is a p type is described, and it is needless to say that this embodiment is also applicable to a p-channel MOSFET in which a first conductivity type is a p type and a second conductivity type is an n type.

In this embodiment, a conductivity type of the silicon carbide substrate 1 is the first conductivity type, but this embodiment is also applicable to an IGBT of a second conductivity type.

Figure 2:
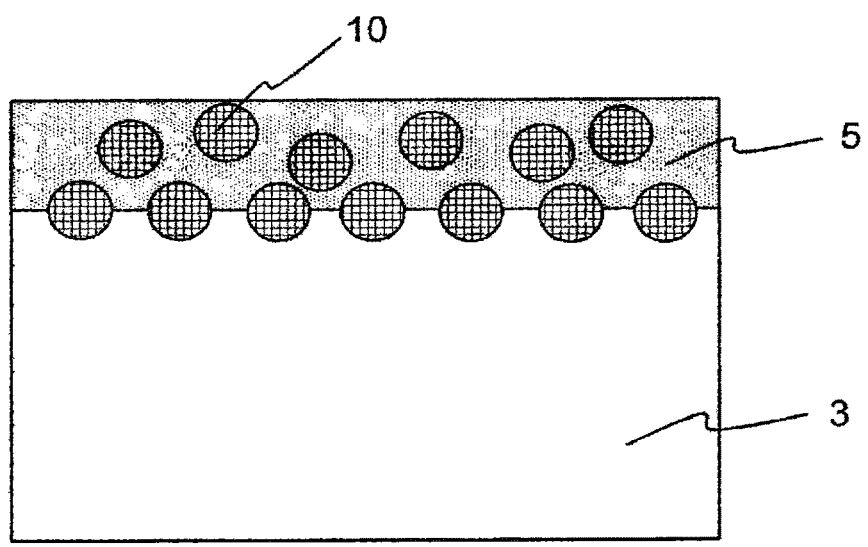
FIG. 2 is an enlarged view around a MOS interface of the silicon carbide semiconductor device in the first embodiment of the present invention.

FIG. 2 shows an enlarged view around a MOS interface being an interface region between the gate insulating film 5 and the well region 3, which is indicated by the dotted line in FIG. 1.

FIG. 2 is an enlarged schematic diagram around the MOS interface of the silicon carbide semiconductor device in this embodiment. As shown in FIG. 2, the gate insulating film 5 has defects 10 including a bond between silicon and hydrogen in the gate insulating film 5 and at the MOS interface being the interface region between the well region 3 and the gate insulating film 5.

FIGS. 3A and 3B are a schematic diagram of an atomic structure showing a bonding state of the defect 10 including the bond between silicon and hydrogen. In the defects shown in FIG. 3A and FIG. 3B, a hydrogen atom substitutes for an oxygen vacancy that should inherently include an oxygen atom (O) therein. A region surrounded by the dotted line indicates the oxygen vacancy in the diagram. The defect in FIG. 3A includes the bond between a hydrogen atom (H) and one of two silicon atoms (Si) adjacent to the oxygen vacancy.

In such manner, when the hydrogen atom substitutes for the oxygen vacancy and is bonded with one of the silicon atoms, which is inherently intended to be bonded with the oxygen atom, the other silicon atom has a dangling bond, thereby resulting in an electrically unstable state. The dangling bond of the silicon atom is indicated by the alternate long and short dashed line in the diagram. The dangling bond causes the electrically unstable state and becomes an interface trap having an energy level deeper than a conduction band end of silicon carbide. If the interface trap is negatively charged, the entire system including FIG. 3A has an electrically stable structure. In other words, the system including FIG. 3A captures electrons in the conduction band so as to take on the electrically stable structure.

A defect shown in FIG. 3B is a defect such that a hydrogen atom is bonded with one of two silicon atoms adjacent to an oxygen vacancy similarly to the defect shown in FIG. 3A. The other silicon atom, which is not bonded with the hydrogen atom, may be directly bonded with the nearest silicon atom so as to take on the electrically stable structure. The bond is indicated by the chain double-dashed line in the diagram. One of silicon atoms bonded by the chain double-dashed line then has a fifth bond. A silicon atom inherently has four bonds, but the silicon atom has the fifth bond, which needs to be negatively charged. In other words, to take on the electrically stable structure, the structure shown in FIG. 3B functions as the interface trap having the energy level deeper than the conduction band end of silicon carbide and captures the electrons in the conduction band.

In this manner, the hydrogen atom substitutes for the oxygen vacancy to form the bonding state shown in FIG. 3A and FIG. 3B, resulting in the electrically unstable state, which becomes the interface trap forming the energy level. The interface trap forms the energy level at a depth of 1.1 eV from the conduction band end of silicon carbide in FIG. 3A, and the interface trap forms the energy level at a depth of 0.72 eV therefrom in FIG. 3B. The energy levels are deeper than the conduction band end of silicon carbide, so that the interface traps become first traps being electrically active and capture electrons.

As regards FIG. 3A and FIG. 3B each showing the defect 10 that includes the bond between silicon and hydrogen, see Peter E. Blochl, "First-principles calculations of defects in oxygen-deficient silica exposed to hydrogen," Physical review B, Volume 62, Number 10, 1 Sep. 2000.

The first traps formed by the defects 10 including the bond between silicon and hydrogen contribute to an increase in a threshold voltage, which will be described below.

FIG. 4 is a diagram showing gate characteristics of the MOSFET in this embodiment. The characteristics of the MOSFET having the defects shown in FIG. 3 in this embodiment are indicated by black dots, and a comparative example to which this embodiment is not applied, namely, a conventional example including no defect 10 including the bond between silicon and hydrogen is indicated by white dots. It is clear from FIG. 4 that a gate voltage when a drain current rises, namely, a threshold voltage $V_{th}$, is greatly shifted to a positive voltage in this embodiment.

The slopes in a linear region surrounded by the dotted line in FIG. 4 after the drain current rises are dependent on channel mobility, but it is clear that the slopes in this embodiment and the conventional example are almost equal. In this manner, the MOSFET in this embodiment can suppress a decrease in the channel mobility and can effectively increase the threshold voltage.

Figure 5:
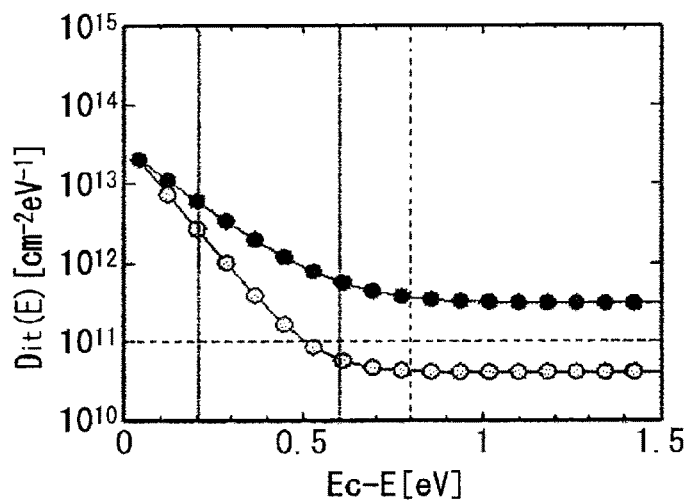
FIG. 5 is a diagram showing a dependence of a density of interface traps at a MOS interface on an energy level of the silicon carbide semiconductor device in the first embodiment of the present invention.

FIG. 5 shows a dependence of a density $D_{it}$ of the interface traps at the MOS interface on an energy level of the MOSFET in this embodiment. The characteristics of the MOSFET having the defects shown in FIG. 3 in this embodiment are indicated by black dots, and a comparative example to which this embodiment is not applied, namely, a conventional example including no defect 10 including the bond between silicon and hydrogen is indicated by white dots. An energy level of the interface traps is indicated by a depth ($E_c$–E) from a conduction band end $E_c$ as in the horizontal axis of FIG. 5. In FIG. 5, the characteristics in this embodiment are indicated by the black dots, and the characteristics to which this embodiment is not applied are indicated by the white dots, as the comparative example.

Figure 6:
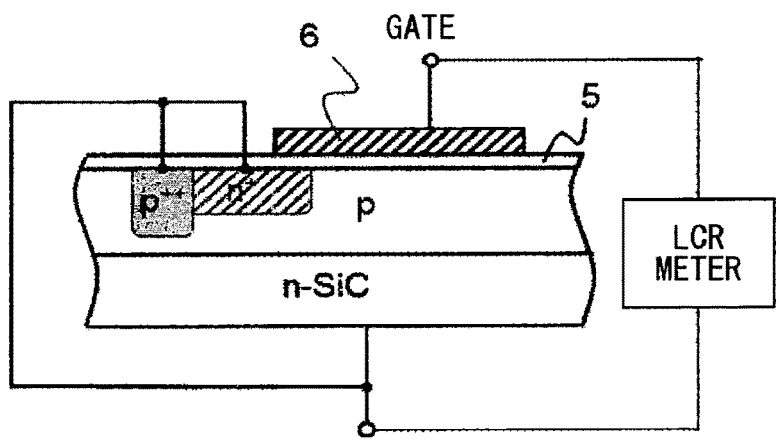
FIG. 6 is a schematic cross-sectional view of a gate controlled diode used for evaluating the density of the interface traps at the MOS interface of the silicon carbide semiconductor device in the first embodiment of the present invention.

An energy level distribution of the density of the interface traps in FIG. 5 is calculated on the basis of capacitance-voltage characteristics obtained by a gate controlled capacitor. FIG. 6 is a schematic cross-sectional view of the gate controlled capacitor in this embodiment. The capacitance-voltage characteristics determined by applying voltage to the gate in FIG. 6 and a theoretical curve are set by fitting, and thus the dependence of $D_{it}$ in FIG. 5 on the energy level can be determined.

As regards a technique for determining the dependence of $D_{it}$ on the energy level from the capacitance-voltage characteristics, see S. M. Sze, "Physics of Semiconductor Devices," $2^{nd}$ Edition, Chapter 7.

The interface traps obtained by the gate controlled capacitor in FIG. 6 are determined while the p-well region at the MOS interface is inverted, so that the interface traps can be evaluated in the same structure as the structure in the operation state of the actual MOSFET. It is thus different from the evaluation using a simple n-capacitor, and the relationship between the density of the interface traps and the channel mobility or the threshold voltage of the MOSFET is accurate when determined by using the gate controlled capacitor.

In FIG. 5, the density of the interface traps in this embodiment is increased, and it is clear that the density of the interface traps having the energy level of 0.6 eV or deeper from the conduction band end (Ec–E=0 eV) is particularly increased. The interface traps that are increased more than those in the conventional example and have the deep energy level from the conduction band end correspond to first traps. For the shallow energy level of 0 to 0.2 eV from the conduction band end, the difference in density $D_{it}$ of the interface traps is small such that the density $D_{it}$ of the interface traps in this embodiment is nearly twice as much as the density $D_{it}$ of the interface traps to which this embodiment is not applied, but it is clear that the density $D_{it}$ of the interface traps having the energy level of 0.6 eV or deeper differs by an order of magnitude. In other words, the energy level distribution of the interface traps in this embodiment can be obtained as in FIG. 5 by adding the first traps to the interface traps in the conventional example.

The interface traps at the MOS interface greatly influence the channel mobility and the threshold voltage of the MOSFET. The MOSFET including silicon carbide in comparison with the MOSFET including silicon has the MOS interface of poor quality and has an extremely high density of the interface traps, thereby decreasing the channel mobility.

Herein, the channel mobility of the MOSFET including silicon carbide is greatly influenced by the density of the interface traps located from the conduction band end to the depth of approximately 0.2 eV at the MOS interface, which is reported in M. Noborio, J. Suda, T. Kimoto, "Enhanced Channel Mobility in 4H—SiC MISFETs by Utilizing Deposited SiN/SiO$_2$ Stack Gate Structures," Mater. Sci. Forum, Vols. 600-603 (2009) pp. 679-682, for example.

Silicon carbide different from silicon has many defects due to C at the MOS interface or in an oxide film, and the defects result in the interface traps having the shallow energy level of approximately 0.2 eV from the conduction band end. For example, a C═C bond has an energy level of 0.14 eV. Some dangling bonds of C or Si have interface traps having a shallow energy level close to a conduction band end. In addition, interface traps particularly having an energy level of approximately 0.1 eV among energy levels from the conduction band end to the depth of 0.2 eV have a greater influence on the channel mobility. It is clear from FIG. 5 that the density of the interface traps having the energy level at the depth of 0.1 eV in this embodiment is almost equal to that in the conventional example to which this embodiment is not applied.

The first traps formed by the defects including the bond between silicon and hydrogen shown in FIG. 3 have the energy level of 0.6 eV or deeper from the conduction band end of silicon carbide. Accordingly, the MOSFET having the defects shown in FIG. 3 particularly increases only the interface traps having the energy level of 0.6 eV or deeper by suppressing an increase in the interface traps that have the energy level of 0.2 eV or shallower and influence the channel mobility and by increasing the first traps that do not greatly influence the channel mobility as in FIG. 5.

In FIG. 5, when the density of the interface traps in this embodiment is compared to that in the conventional example, densities of the interface traps also increase in energy levels except for the energy levels at the depth of the defect of 1.1 eV in FIG. 3A and at the depth of the defect of 0.72 eV in FIG. 3B. The reason is that the defects shown in FIG. 3A and FIG. 3B have not only a single energy level but also energy levels with a certain width with respect to each energy level. For example, if an atomic arrangement is misaligned when the defects are generated or if the defects in FIG. 3A and FIG. 3B partially deformed are generated, interface traps having an energy level different from the energy levels of 0.72 eV and 1.1 eV are also generated. It should be noted that a rate in occurrence of the interface traps is gradually decreased at the energy level of 0.6 eV or shallower.

In logarithmic plots of FIG. 5, a density $D_{it}$ (E) of the interface traps having an energy level ($E_c$–E) [eV] at a depth from an energy level $E_c$ of a conduction band end of silicon carbide is set by fitting in Math 1, assuming that A [cm$^{-2}$eV$^{-1}$], B [cm$^{-2}$eV$^{-1}$], and X [eV] are coefficients.

$$D_{it}(E) = A + B\exp\left(-\frac{E_c - E}{X}\right) \quad \text{[Math 1]}$$

Herein, it is assumed that an asymptotic value of a density $D_{it}$ of the interface traps having an energy level ($E_c$–E) of ∞ [eV] is the coefficient A [cm$^{-2}$eV$^{-1}$], the coefficient B [cm$^{-2}$eV$^{-1}$] is a value in which a density $D_{it}$ of the interface traps having an energy level ($E_c$–E) of 0 [eV] is equal to (A+B) [cm$^{-2}$eV$^{-1}$], and the coefficient X [eV] corresponds to a slope of an energy level distribution of a density of the interface traps having an energy level at a depth of 0.1 eV or greater and 0.4 eV or less.

The slope X is determined by the least squares method from Math 1 in FIG. 5. It is determined from the conventional example in FIG. 5 that the coefficient X is 0.08 eV. On the other hand, it is determined from the data indicating the black dots of this embodiment in FIG. 5 that the coefficient X is 0.13 eV. The silicon carbide semiconductor device in this embodiment can increase a rate of interface traps having a deep energy level, and thus gradient of a transition region from a shallow energy level to a deep energy level can be reduced, allowing for a smaller coefficient X being the slope.

In other words, the silicon carbide semiconductor device in this embodiment can suppress the rate of increase in the density of the interface traps having the shallow energy level so as to increase the coefficient X. This can increase the interface traps having the deep energy level while minimizing the increase in the interface traps that have the shallow energy level and greatly influence the channel mobility.

A threshold voltage is dependent on a density of interface traps regardless of an energy level and is increased by an amount of electrons captured at the MOS interface. At ambient temperature, electrons are more likely to be captured by the interface traps deeper than 0.1 eV from the conduction band end of silicon carbide, for example, so that the threshold voltage increases as the interface traps having any energy levels deeper than 0.1 eV increase. In other words, even if the interface traps having an energy level of 0.6 eV or deeper from the conduction band end occur, the threshold voltage increases.

To suppress the decrease in the channel mobility and increase the threshold voltage, it can thus be said that an increase in interface traps having an energy level shallower than 0.2 eV from the conduction band end needs to be suppressed, and that interface traps having an energy level sufficiently deeper than 0.2 eV, for example, an energy level deeper than 0.6 eV from the conduction band end, need to be increased.

As in FIG. 5, in the MOSFET having the defects shown in FIG. 3 in this embodiment compared to the comparative example, the interface traps having the level shallower than 0.2 eV from the conduction band end are hardly increased while the interface traps having the energy level deeper than 0.2 eV, particularly, the energy level deeper than 0.6 eV are greatly increased. This can suppress the decrease in the channel mobility and can greatly increase the threshold voltage similarly to the gate characteristics shown in FIG. 4.

In this manner, the inventors find out that the defect 10 including the bond between silicon and hydrogen shown in FIG. 3 can suppress the occurrence of the interface traps having the energy level shallower than 0.2 eV from the conduction band end and can greatly increase the interface traps having the energy level deeper than 0.6 eV.

Next, a method for manufacturing the silicon carbide semiconductor device in the first embodiment is described.

Figure 7:
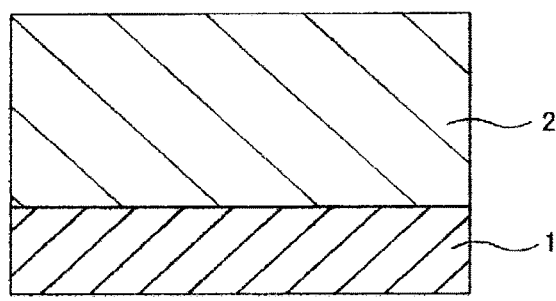
FIG. 7 is a cross-sectional view for describing a manufacturing method until formation of a drift layer in the silicon carbide semiconductor device in the first embodiment of the present invention.

FIG. 7 is cross-sectional view for describing the manufacturing method until formation of the drift layer 2 in the silicon carbide semiconductor device in this embodiment.

First, the silicon carbide substrate 1 of the first conductivity type, which is the n type, is prepared. Next, as in FIG.

7, the drift layer 2 of the first conductivity type made of silicon carbide is formed on the surface being the first, main surface of the silicon carbide substrate 1 by epitaxial crystal growth. In this embodiment 4H—SiC is used as the silicon carbide substrate 1, and a plane direction of the first main surface is a (0001) plane having an off-angle of 4° in a <11-20> direction.

Figure 8:
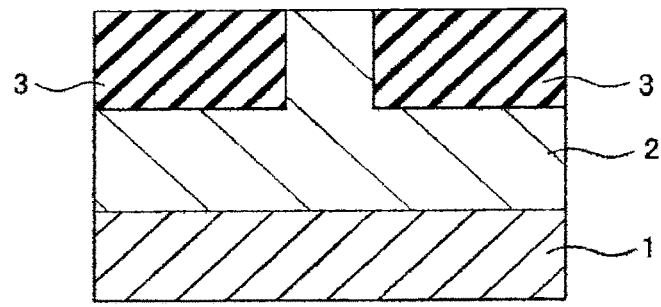
FIG. 8 is a cross-sectional view for describing the manufacturing method until formation of well regions in the silicon carbide semiconductor device in the first embodiment of the present invention.

FIG. 8 is a cross-sectional view for describing the manufacturing method until formation of the well regions 3 in the silicon carbide semiconductor device in this embodiment. The pair of well region 3 of the second conductivity type are formed by ion-implanting impurities into portions of the surface layer portion of the drift layer 2 with a resist as a mask, the portions being located at a predetermined interval. FIG. 8 is a cross-sectional view after removal of the resist. Examples of the impurities of the p type, namely, the second conductivity type at the time of the ion implantation include boron (B) and aluminum (Al).

Figure 9:
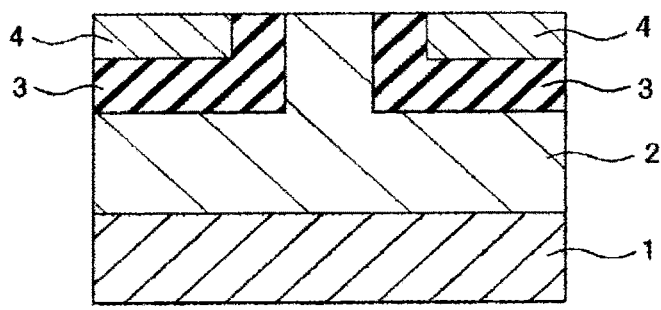
FIG. 9 is a cross-sectional view for describing the manufacturing method until formation of source regions in the silicon carbide semiconductor device in the first embodiment of the present invention.

FIG. 9 is a cross-sectional view for describing the manufacturing method until formation of the source regions 4 in the silicon carbide semiconductor device in this embodiment. The source regions 4 of the first conductivity type are formed by ion-implanting impurities into the surface layer portion of the well region 3 with a resist as a mask. FIG. 9 is a cross-sectional view after removal of the resist. Examples of the impurities of the n type, namely, the first conductivity type, at the time of the ion implantation include phosphorus (P) and nitrogen (N).

After the ion implantation of the n type impurities and the p type impurities, the structure shown in FIG. 9 is heat-treated at high temperature by a heat treatment device, which electrically activates the implanted ions.

Figure 10:
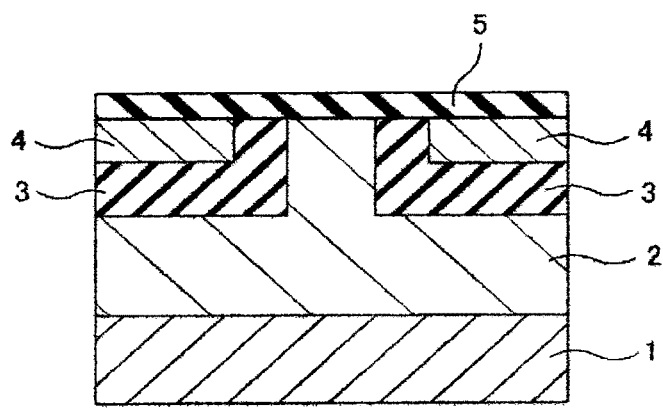
FIG. 10 is a cross-sectional view for describing the manufacturing method until formation of a gate insulating film in the silicon carbide semiconductor device in the first embodiment of the present invention.

FIG. 10 is a cross-sectional view for describing the manufacturing method until formation of the gate insulating film 5 in the silicon carbide semiconductor device in this embodiment. As shown in FIG. 10, a silicon dioxide film ($SiO_2$ film) is formed as the gate insulating film 5 on the entire surface of the drift layer 2. The $SiO_2$ film serving as the gate insulating film 5 may be a thermal oxide film formed by thermal oxidation and may be a deposited film formed by chemical vapor deposition (CVD). The $SiO_2$ film on silicon carbide has excellent insulation characteristics, so that the gate insulating film 5 having high reliability can be formed.

To form the $SiO_2$ film by thermal oxidation of silicon carbide, temperatures of 1100° C. or higher are needed. Herein, the interface traps at the MOS interface of silicon carbide, which cause the decrease in the channel mobility, are known as the interface traps due to C as described above. The interface traps due to C are conceivably generated by surplus C occurring when the thermal oxidation of silicon carbide progresses. For the $SiO_2$ film formed by the thermal oxidation of silicon carbide, it is known that the thermal oxidation accelerated at high temperature increases the surplus C, and thus many interface traps due to C occur, to thereby cause the decrease in the channel mobility.

The deposited film by CVD is formed by reaction between silicon supply gas and oxygen supply gas at temperatures of 900° C. or lower and by the deposition of the $SiO_2$ film on silicon carbide. Even in such CVD, the silicon carbide substrate 1 including the structure of FIG. 8 is exposed to high temperature to some extent in an atmosphere of the oxygen supply gas, so that the thermal oxidation progresses. However, the $SiO_2$ film can be formed at low temperatures of 800° C. or lower, which suppresses the oxidation of silicon carbide and thereby reduces the interface traps.

Moreover, a silicon oxynitride film, $Al_2O_3$, or $HfO_2$, or the like, or a laminated film of these may be used as the gate insulating film 5. Oxygen atoms need to be supplied to form the films, but the thermal oxidation of silicon carbide slightly progresses by the oxygen atoms, so that the $SiO_2$ film is slightly formed around the MOS interface. It should be noted that $Al_2O_3$, $HfO_2$, or the like is deposited at temperatures of 500° C. or lower, which can be lower than those for the $SiO_2$ film by deposition, and thus occurrence of the interface traps can be further suppressed.

After the gate insulating film 5 is formed, the silicon carbide substrate 1 obtained in FIG. 9 is subjected to reoxidation in a water vapor atmosphere. The defects 10 including the bond between silicon and hydrogen at the MOS interface as shown in FIGS. 2 and 3 can generate the first traps by the reoxidation.

Heat treatment temperatures in the reoxidation step in the water vapor atmosphere are preferably 500° C. or higher and 1000° C. or lower, particularly, 600° C. or higher and 950° C. or lower.

For heat treatment temperatures of 1000° C. or higher in this step, silicon carbide is further oxidized. In other words, thermal oxidation of silicon carbide is accelerated in the reoxidation, which newly generates surplus C at the MOS interface. As a result, many interface traps are newly generated at the MOS interface, thereby significantly decreasing the channel mobility of the MOSFET.

Moreover, for heat treatment temperatures of less than 500° C., the effects of the reoxidation cannot be sufficiently obtained. In other words, the defects 10 including the bond between silicon and hydrogen as described in FIGS. 2 and 3 fail to generate the first traps. The reason is that OH⁻ described below fails to sufficiently spread out in the gate insulating film 5 and at the MOS interface. A generation speed of the first traps is dependent on temperature, and the first traps can be generated for a short period of time as temperature is higher.

For heat treatment temperature of 600° C. or higher and 950° C. or lower, the defects 10 including the bond between silicon and hydrogen as shown in FIGS. 2 and 3 can effectively generate the first traps, and furthermore, the progress of the thermal oxidation of silicon carbide in the reoxidation can be suppressed.

In addition, heat treatment time in the reoxidation step ranges from approximately 10 minutes to 5 hours, and the heat treatment is performed for 30 minutes to an hour in this embodiment.

The reoxidation is performed in a water vapor atmosphere in which a burning reaction between oxygen gas ($O_2$) and hydrogen gas ($H_2$) occurs. A flow rate ratio of hydrogen and oxygen ($H_2/O_2$ flow rate ratio) at this time is 0.7 or more and 1.9 or less.

Figure 11:
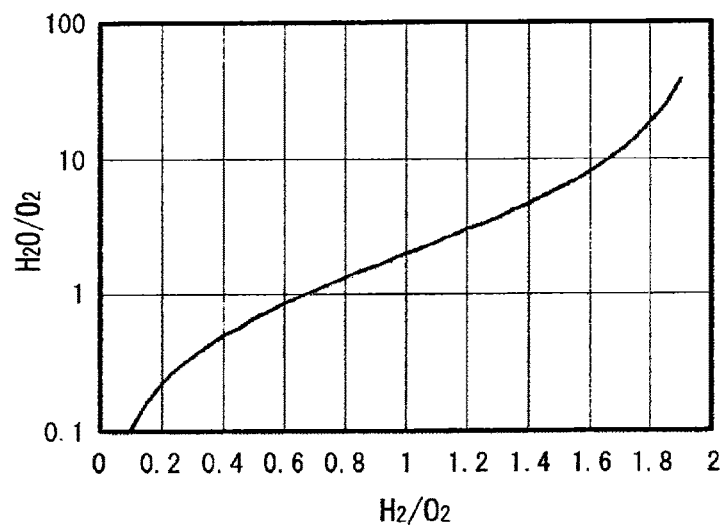
FIG. 11 shows a flow rate ratio of $H_2O$ and $O_2$ after a burning reaction with respect to a flow rate ratio of $H_2$ and $O_2$ in a reoxidation step performed when manufacturing the silicon carbide semiconductor device in the first embodiment of the present invention.

FIG. 11 shows a ratio of $H_2O$ and $O_2$ after the burning reaction with respect to a flow rate ratio of $H_2$ and $O_2$. $H_2O$ (water vapor) formed by the burning reaction contributes to the generation of the defects 10 including the bond between silicon and hydrogen shown in FIG. 3. On the other hand, $O_2$ generated by the burning reaction causes only the oxidation of silicon carbide. In other words, $O_2$ does not generate the first traps formed by the defects 10 including the bond between silicon and hydrogen, and $O_2$ generates the interface traps due to the surplus C.

Thus, the flow rate of $H_2O$ after the burning reaction is preferably greater than the flow rate of $O_2$. A chemical reaction speed of $H_2O$ is faster than that of $O_2$. The reason is that, for example, hydrogen atoms smaller than oxygen atoms easily spread out in the gate insulating film 5 and at the MOS interface. Thus, if the flow rate of $O_2$ is greater than the flow rate of $H_2O$, a reaction of $H_2O$ is accelerated more than a thermal oxidation reaction of $O_2$ and the occurrence of the surplus C is suppressed, and thus the defects 10 including the bond between silicon and hydrogen can generate many first traps. By limiting temperature in the reoxidation step in this embodiment to 600° C. or higher and 950° C. or lower, increasing the flow rate of $H_2O$ greater than that of $O_2$ can synergistically enhance the effect of suppressing the occurrence of the surplus C in addition to the effect of suppressing the thermal oxidation reaction itself of $O_2$.

It is clear from FIG. 11 that a ratio of $H_2/O_2$ needs to be 0.7 or more to set the flow rate of $H_2O$ greater than that of $O_2$, that is to say, to set a ratio of $H_2O/O_2$ to 1 or more. If the ratio of $H_2O/O_2$ is 1 or more and a heat treatment temperature is 600° C. or higher and 950° C. or lower, an influence of the thermal oxidation by $O_2$ can be actually suppressed to the extent the can be almost ignored.

To completely burn the hydrogen gas at the time of the burning reaction, the ratio of $H_2/O_2$ needs to be 1.9 or less. When the flow rate ratio exceeds 2, all the hydrogen gas ($H_2$) is not burned, and thus an atmosphere of the heat treatment contains $H_2$ except for $H_2O$ and $O_2$.

Herein, a difference in reaction between $H_2$ and $H_2O$ is described. First, for the sake of simplicity, a heat treatment in an atmosphere of 100% $H_2$ and a heat treatment in an atmosphere of 100% $H_2O$ are described.

In the atmosphere of $H_2$, a reaction with $H^+$ generated by decomposition of $H_2$ at high temperature proceeds. At this time, a dangling bond of silicon or carbon being a type of interface traps at the MOS interface is terminated by $H^+$. Herein, the dangling bond of silicon or carbon is known to be an interface trap having an energy level of 0.2 eV or shallower from a conduction band end. In other words, the dangling bond is negatively charged. The dangling bond attracts $H^+$ having a positive charge and is terminated by $H^+$, so that the dangling bond becomes electrically inert, which reduces interface traps.

In the atmosphere of $H_2O$, a reaction with $OH^-$ generated by decomposition of $H_2O$ at high temperature proceeds. A defect referred to as an oxygen vacancy in which oxygen is not located where oxygen inherently, namely, ideally should be is in an oxide film or at the MOS interface. In the gate insulating film 5, a density of oxygen vacancies is particularly high at the MOS interface being an interface region. The oxygen vacancies are defects supposed to be electrically stable ideally with $O^{2-}$, but the oxygen vacancies are defects being vacancies without $O^{2-}$. The oxygen vacancies are positively charged to be electrically stable. The oxygen vacancies positively charged attract $OH^-$ having a negative charge, and a reaction in which hydrogen atoms substitute for the oxygen vacancies occurs, to thereby generate the defects shown in FIG. 3.

In this manner, the oxygen vacancies positively charged need to attract $OH^-$ having the negative charge to generate the defects shown in FIG. 3. However, in the atmosphere of $H_2$, $H^+$ has the positive charge, and thus a force that separates $OH^-$ from the oxygen vacancies positively charged is exerted, and the oxygen vacancies are hardly substituted.

Next, an atmosphere in which $H_2O$ and $H_2$ are mixed is described. $H_2O$ as described above substitutes for the oxygen vacancies to form the defects shown in FIG. 3 and contributes to the generation of the interface traps having the energy level of 0.6 eV or deeper from the conduction band end. $H_2$ terminates the dangling bond and has the effect of reducing the interface traps having the energy level of 0.2 eV or shallower from the conduction band end, but the first traps by the defects in FIG. 3 formed by $H_2O$ are also reduced at the same time.

The defects shown in FIG. 3A and FIG. 3B form the first traps, capture electrons, and are negatively charged. For this reason, $H^+$ having the positive charge is attracted, and the dangling bond of Si indicated by the alternate long and short dashed line in FIG. 3A, for example, is terminated, leading to the electrically stable structure. The bond indicated by the chain double-dashed line in FIG. 3B is broken and bonded to Si having the dangling bond, leading to the electrically stable structure. In other words, the first traps formed by the defects 10 including the bond between silicon and hydrogen in FIGS. 3A and 3B are electrically inert.

As described above, in the case where $H_2$ gas is not completely burned at the time of the burning reaction and the reoxidation step contains the $H_2$ gas, $H_2$ reduces the first traps formed by $H_2O$ for increasing the threshold voltage, which reduces the effect of increasing the threshold voltage.

For this reason, it is desired that the hydrogen gas is completely burned at the time of the burning reaction. The hydrogen gas is completely burned, so that $H^+$ does not reduce the defects in FIG. 3, namely, the first traps in the reoxidation step, and only the reaction with $OH^-$ can effectively increase the threshold voltage.

The widely-known conventional reoxidation has been performed for the purpose of reducing the whole interface traps for increasing channel mobility. Thus, it has been performed for the purpose of terminating dangling bonds of silicon or carbon and making inert interface traps, and the conditions that increase the interface traps having the deep level as in this embodiment have not been known. Even if the conventional reoxidation increases a threshold voltage, the main factor is that fixed charges are increased in the gate insulating film 5. In this case, a density of the fixed charges that can be generated is lower than a density of the interface traps that can be generated at the MOS interface, and the increase in the fixed charges is limited in terms of insulation characteristics of the gate insulating film 5. Further, the fixed charges in the gate insulating film 5 often contain H and OH that are not bonded with silicon and are single, and the fixed charges are emitted from the gate insulating film 5 in the heat treatment at 1000° C. or lower performed in an electrode process or the like, so that the threshold voltage is changed in some cases. Therefore, it is desired that the threshold voltage is more effectively and stably increased.

This embodiment optimizes the flow rate ratio of $H_2/O_2$, so that the defects shown in FIG. 3 can be effectively generated at the MOS interface having many oxygen vacancies, and this can effectively increase the threshold voltage while suppressing the decrease in the channel mobility. Further, the defects 10 including the bond between silicon and hydrogen are stable against heat, so that the threshold voltage obtained in this embodiment can also obtain stability against the heat treatment performed in the electrode process or the like.

Figure 12:
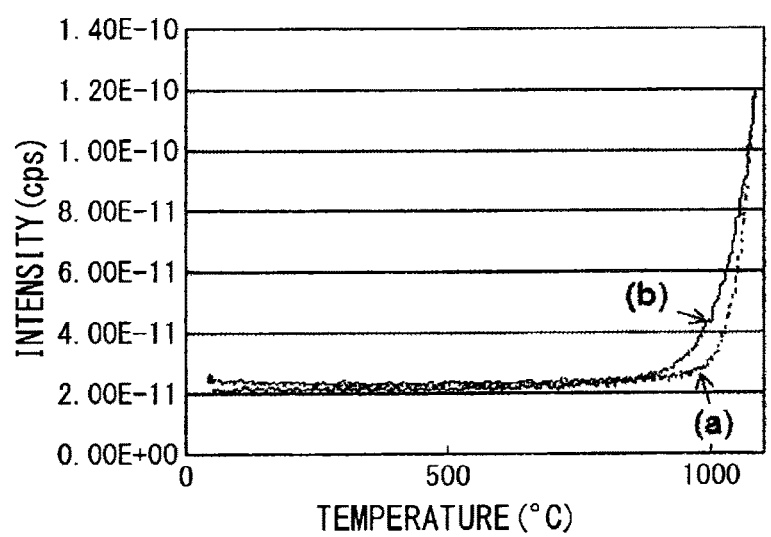
FIG. 12 shows results of thermal desorption spectroscopy of the gate insulating film of the silicon carbide semiconductor device in the first embodiment of the present invention.

FIG. 12 shows results of thermal desorption spectroscopy of the gate insulating film 5 subjected to reoxidation in this embodiment. A temperature is increased from ambient temperature to 1100° C., and a detected amount of hydrogen desorbed from the gate insulating film 5 is evaluated.

FIG. 12 indicates a background detected from a measurement system by a dotted line (a). It is clear from a measurement result of the gate insulating film 5 of the silicon carbide semiconductor device in this embodiment indicated by a solid line (b) that hydrogen is not detected except for the hydrogen at about 1000° C. detected from the background. This indicates that the hydrogen in the stable bonding state is bonded with silicon as shown in FIG. 3 instead of being the single atoms and being in a state with a weak bond.

In addition, H$_2$O gas may be diluted with an inert gas such as N$_2$ and Ar in the reoxidation.

In this embodiment, changing reoxidation temperature or reoxidation time within the range described above can control a threshold voltage within a predetermined range while channel mobility is maintained at an almost constant value.

A dependence of a density of interface traps on an energy level is determined, assuming that reoxidation temperatures are 600° C. to 900° C. A ratio R is determined from Math 2, assuming that D$_{it}$ in which an energy level has a depth of 0.1 eV is a reference value D$_{it}$1 [cm$^{-2}$eV$^{-1}$], a difference between D$_{it}$ in which an energy level is 0.2 eV and D$_{it}$1 is D$_{it}$2 [cm$^{-2}$eV$^{-1}$], and a difference between D$_{it}$ in which an energy level is 0.8 eV and D$_{it}$1 is D$_{it}$8 [cm$^{-2}$eV$^{-1}$].

$$R = \frac{D_{it}2}{D_{it}8}$$ [Math 2]

Figure 13:
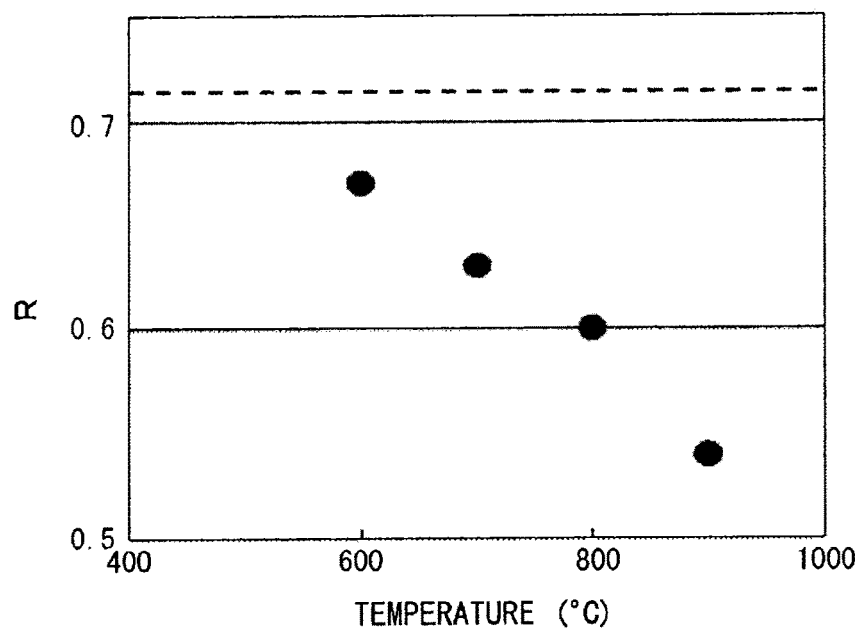
FIG. 13 is a diagram showing a dependence of a ratio R on temperature of the silicon carbide semiconductor device in the first embodiment of the present invention.

FIG. 13 is a diagram showing a dependence of the ratio R determined from the densities of the interface traps of 0.2 eV and 0.8 eV on reoxidation temperature. The conventional example in which the reoxidation is not performed is indicated by a dotted line in the diagram.

Figure 14:
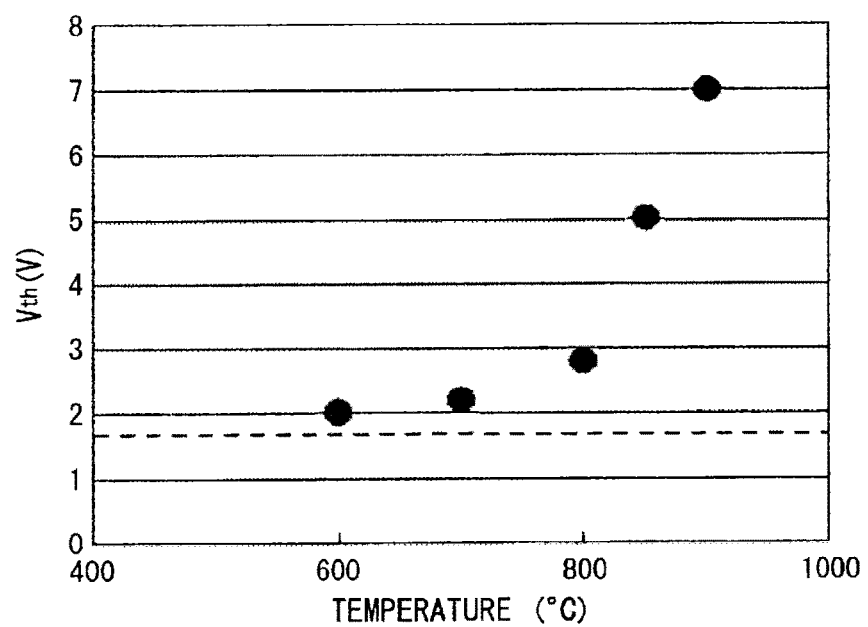
FIG. 14 is a diagram showing a dependence of a threshold voltage on temperature of the silicon carbide semiconductor device in the first embodiment of the present invention.

In FIG. 13, the ratio R is 0.71 when the reoxidation is not performed, the ratio R is 0.67 when the reoxidation is performed at 600° C., and the ratio R is 0.54 when the reoxidation temperature is 900° C., the ratio R being linearly decreased as the reoxidation temperature increases. FIG. 14 shows threshold voltage of the MOSFET corresponding to FIG. 13. In FIG. 14, the threshold voltage is 1.3 V when the reoxidation is not performed, and the threshold voltage is increased to 2.3 V when the reoxidation is performed at 600° C., and furthermore, the threshold voltage is increased as the reoxidation temperature increases.

For the threshold voltage of less than 2 V, high-temperature operations and variations in threshold voltage with time may cause normally-on characteristics, and thus measures against the normally-on characteristics need to be taken in peripheral circuits of the semiconductor device. In this embodiment, the ratio R is changed from 0.54 to 0.67, so that the threshold voltage of 2 V or more from which the normally-off characteristics can be reliably obtained even at high temperature can be obtained. In addition, if the ratio R is set to smaller than 0.54, the interface traps having the energy level of 0.2 eV or shallower are increased, leading to the decrease in the channel mobility, which is not preferable.

After the completion of the reoxidation, temperature drops in an atmosphere of an inert gas such as N$_2$ and Ar, which makes it easy to emit interstitial hydrogen atoms that remain in the gate insulating film 5, are not bonded with silicon, and are single atoms. The interstitial hydrogen atoms can easily move in the oxide film being the gate insulating film 5 and may become mobile ions or the like, so that emitting the interstitial hydrogen atoms increases reliability of the oxide film.

Figure 15:
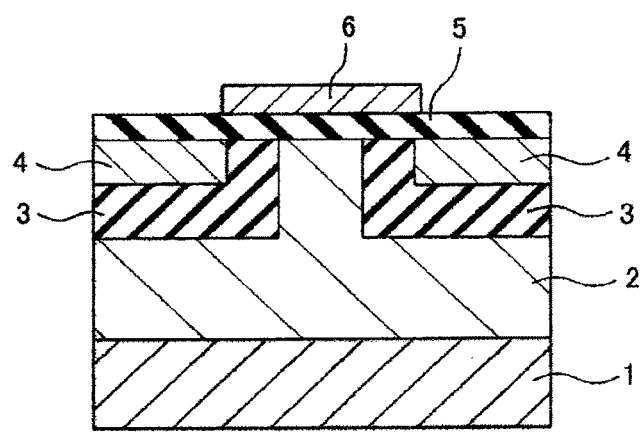
FIG. 15 is a cross-sectional view for describing the manufacturing method until formation of a gate electrode in the silicon carbide semiconductor device in the first embodiment of the present invention.

FIG. 15 is a cross-sectional view for describing the method for manufacturing a silicon carbide semiconductor device in this embodiment until completion of the gate electrode 6. The gate electrode 6 is formed on the gate insulating film 5 and is patterned. The gate electrode 6 is patterned into a shape having both end portions on which the pair of base regions 3 and the source regions 4 are located and having the midsection on which the drift layer 2 exposed from the portion between the base regions 3 is located.

Further, after the remaining portion of the gate insulating film 5 on each of the source regions 4 is removed by a lithography technique and an etching technique, the source electrode 7 is formed on the portions of the source regions 4 exposed to the surface and the source electrode 7 is patterned. The drain electrode 8 is formed on the second main surface of the silicon carbide substrate 1, and the silicon carbide semiconductor device in this embodiment shown in FIG. 1 is completed.

The silicon carbide semiconductor device in this embodiment can increase the threshold voltage and improve the trade-off relationship between the channel mobility and the threshold voltage without reducing the channel mobility.

Figure 16:
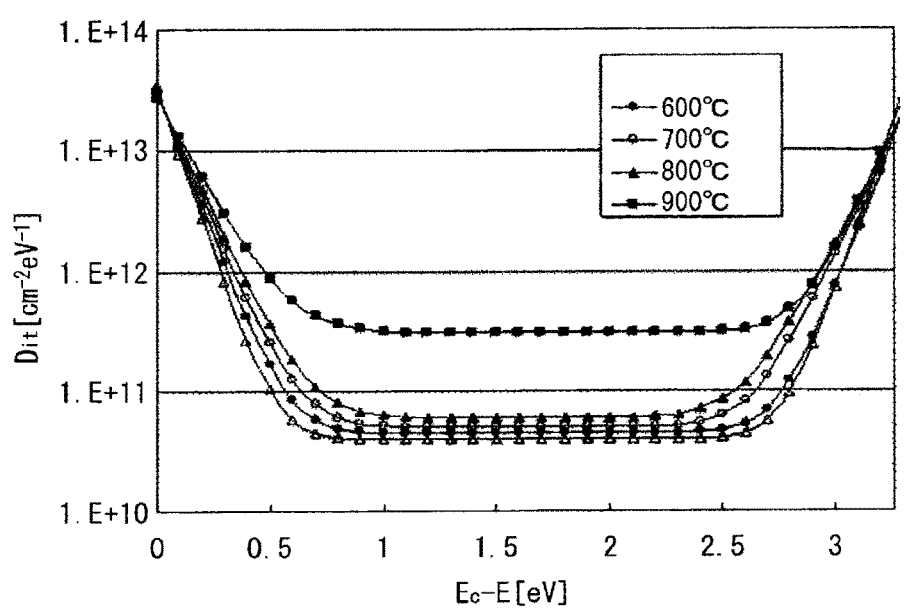
FIG. 16 shows a dependence of a density of interface traps at a MOS interface when reoxidation temperature is changed on an energy level in the silicon carbide semiconductor device in the first embodiment of the present invention.
Figure 17:
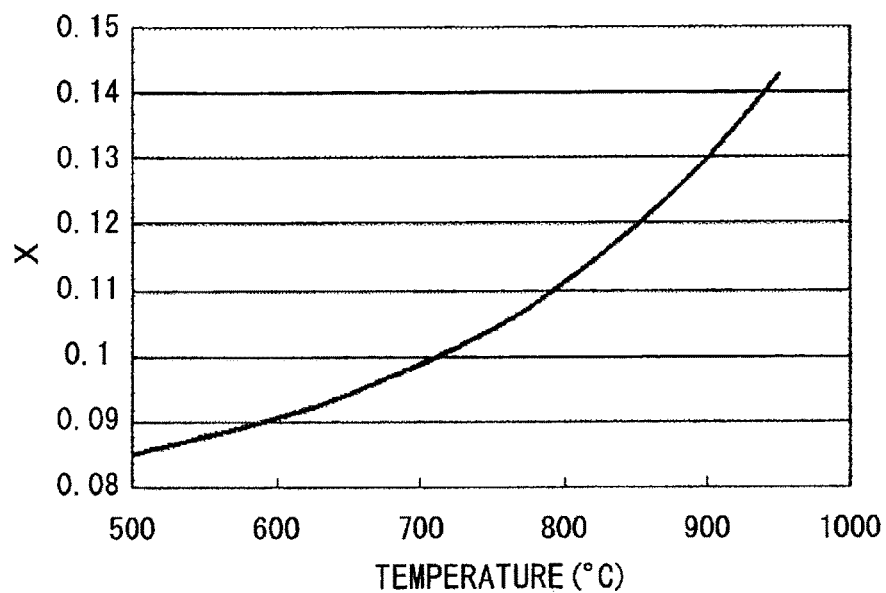
FIG. 17 shows a dependence of a coefficient X on reoxidation temperature in the silicon carbide semiconductor device in the first embodiment of the present invention.

A heat treatment temperature in reoxidation s changed, and a dependence of a density of the interface traps at the MOS interface on an energy level is evaluated. FIG. 16 shows a dependence of the density of the interface traps at the MOS interface, when temperature conditions in the reoxidation are changed, on the energy level in the silicon carbide semiconductor device in this embodiment. The conventional example to which this embodiment is not applied is indicated by white triangle plots in FIG. 16. FIG. 17 shows the result from FIG. 16 in which the coefficient X in Math 1 is determined by using the least squares method. FIG. 17 shows a dependence of the coefficient X on reoxidation temperature. In FIG. 17, the coefficient X is 0.09 or more and 0.14 or less in a range of the reoxidation temperatures from 600° C. to 950° C. In FIG. 16, D$_{it}$ in which the energy level is at the depth of 0.8 eV has conventionally been 6×10$^{10}$ cm$^{-2}$eV$^{-1}$, but it is determined that D$_{it}$ is 1×10$^{11}$ cm$^{-2}$eV$^1$ or more in this embodiment.

In other words, this embodiment can increase the coefficient X, so that the density of the interface traps having the energy level of 0.6 eV or deeper can be increased and D$_{it}$ at the depth of 0.8 eV can be set to 1×10$^{11}$ cm$^{-2}$eV$^{-1}$ or more while the increase in the density of the interface traps having the shallow level is suppressed. The energy level distribution of the interface traps can achieve the MOSFET having a high threshold voltage and high channel mobility.

Figure 18:
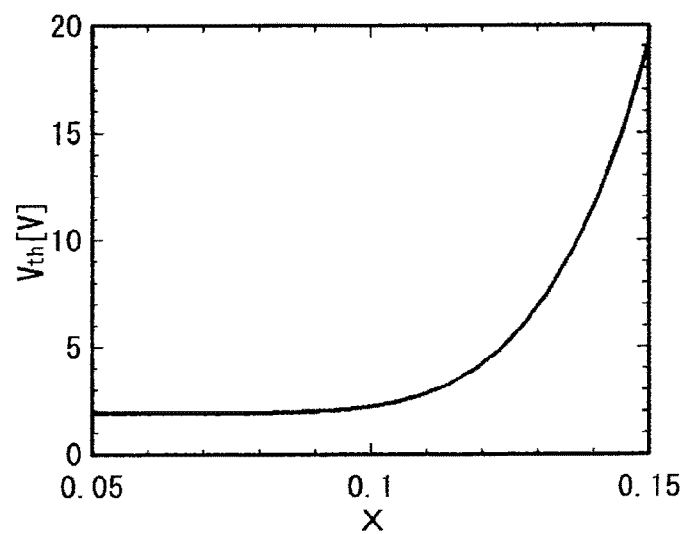
FIG. 18 shows a relationship between the coefficient X and the threshold voltage in the silicon carbide semiconductor device in the first embodiment of the present invention.

FIG. 18 shows a relationship between the coefficient X and the threshold voltage in the silicon carbide semiconductor device in this embodiment. For the conventional example to which this embodiment is not applied, namely, the example that does not perform reoxidation and does not include the defects 10 including the bond between silicon and hydrogen, it is determined that the coefficient X in FIG. 5 is 0.08 as described above. At this time, the threshold voltage is 1.7 V. It is clear from FIG. 18 that a threshold voltage V$_{th}$ gradually increases when the coefficient X is 0.09 or more. In other words, to increase the threshold voltage, the coefficient X needs to be 0.09 or more.

For the coefficient X of 0.09, the threshold voltage is 2.01 V. Further, it is clear that the threshold voltage increases as the coefficient X increases. When the coefficient X is greater than 0.14, the increase in the interface traps having the energy level of 0.2 eV or shallower from the conduction band end becomes greater, as described above. Thus, it is desired that the coefficient X is 0.09 or more and 0.14 or less to achieve the threshold voltage of 2 V and suppress the decrease in the channel mobility.

Figure 19:
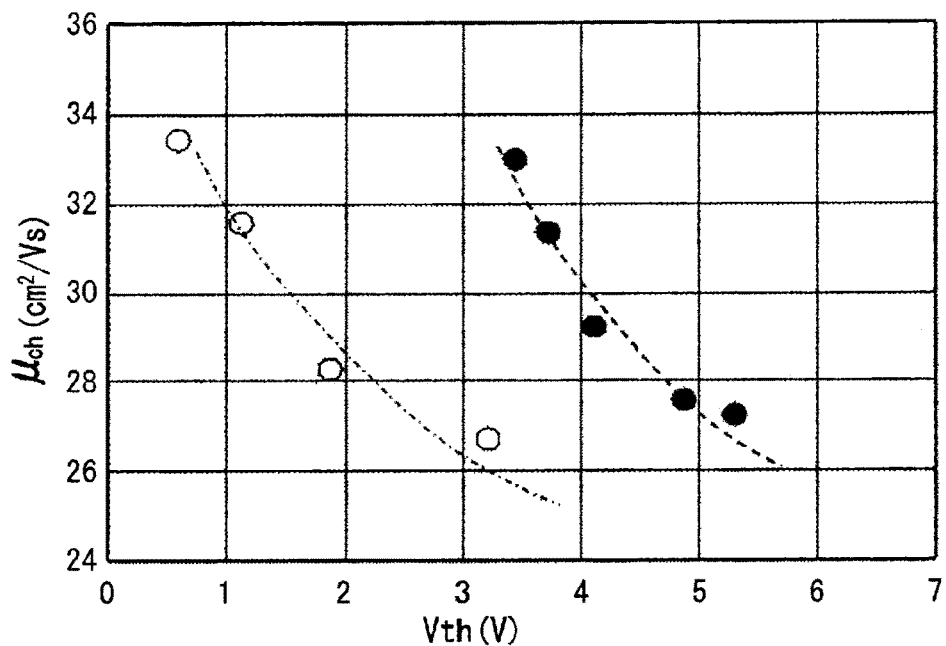
FIG. 19 shows a relationship between channel mobility and the threshold voltage of the silicon carbide semiconductor device in the first embodiment of the present invention.

FIG. 19 shows a relationship between channel mobility μ$_{ch}$ and the threshold voltage V$_{th}$ of the silicon carbide semiconductor device in this embodiment. The example in this embodiment is indicated by black dots, and the conventional example to which this embodiment is not applied is indicated by white dots. As characteristics of the semiconductor device, it is desired to achieve a low ON resistance, namely, high channel mobility and a high threshold voltage. As shown in FIG. 19, the threshold voltage has conventionally been decreased so as to achieve the high channel mobility, and the channel mobility has conventionally been decreased so as to achieve the high threshold voltage, which is referred to as the trade-off relationship. In other words, the channel mobility and the threshold voltage can hardly obtain the characteristics that are deviated from the trade-off curve plotted on the alternate long and short dashed curve in FIG. 19. In addition, different channel mobility can be obtained by changing the concentration of the well regions 3. In other words, the data of the white dots in FIG. 19 can be obtained from the data on the alternate long and short dashed line by changing the concentration of the well regions 3.

In this embodiment, the threshold voltage can be increased, so that the alternate long and short dashed curve can be shifted to the high threshold voltage side similarly to the curve indicated by the dotted line in FIG. 19.

In FIG. 19, to achieve the channel mobility $\mu_{ch}$ of 33 cm$^2$/Vs, the threshold voltage $V_{th}$ has conventionally been 0.5 V, and the measures against the normally-on characteristics have needed to be taken in the peripheral circuits. In this embodiment, the threshold voltage is 3.5 V while about the same channel mobility is maintained, and the normally-off characteristics that do not need the measures against the normally-on characteristics in the peripheral circuits can be achieved.

In this embodiment, the interface traps at the MOS interface are described, but the defects shown in FIG. 3 may be formed in the gate insulating film 5. Also in a case where the defects shown in FIG. 3 are formed in the gate insulating film 5, second traps are formed in the gate insulating film 5 due to the electrically unstable structure and electrons are captured. In other words, the second traps capturing the electrons function as negative fixed charges and increase the threshold voltage such that the second traps are negatively charged. In addition, the second traps do not influence channel mobility when formed in the gate insulating film 5.

In other words, the gate insulating film 5 has the effect of further increasing the threshold voltage if the traps by the defects 10 including the bond between silicon and hydrogen are formed at the MOS interface and in the gate insulating film 5.

Herein, the defects 10 including the bond between silicon and hydrogen conceivable have structures except for the structures of the defects shown in FIG. 3, but defects that have the energy level deeper than the conduction band end of silicon carbide and that form the interface traps only have the energy level of 0.6 eV or deeper from the conduction band end.

Figure 20:
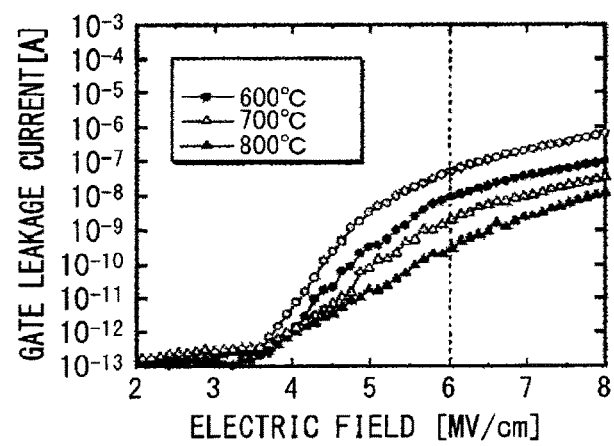
FIG. 20 is a diagram showing a gate leakage current with respect to a gate voltage of the silicon carbide semiconductor device in the first embodiment of the present invention.

FIG. 20 shows a gate leakage current with respect to an electric field of the gate insulating film 5 of the MOSFET in this embodiment. In addition, FIG. 20 is determined by measuring a gate current when a voltage is applied to the gate insulating film 5. In other words, the horizontal axis represents an electric field determined from the applied gate voltage divided by a thickness of the gate insulating film 5.

The comparative example to which this embodiment is not applied is indicated by white dots, and it is assumed that this embodiment performs reoxidation at 600° C., 700° C., and 800° C. whose reoxidation times are all the same. It is clear from FIG. 20 that a gate leakage current is reduced in this embodiment. Further, the leakage current is reduced more as the temperature in the reoxidation increases.

As the temperature in the reoxidation increases, the defects 10 including the bond between silicon and hydrogen shown in FIG. 3 increase and more first traps are formed, thereby increasing the threshold voltage. When the threshold voltage increases, a voltage, which is subtracted by the threshold voltage, of the applied gate voltage is actually applied to the gate insulating film 5. Thus, the voltage actually applied to the gate insulating film 5 is reduced by performing the reoxidation and is more reduced when the reoxidation temperature is high, so that the reliability of the gate insulating film 5 conceivably increases.

In this embodiment, the defects 10 including the bond between silicon and hydrogen are described as the defects forming the first traps having the energy level deeper than the conduction band end, and the defects 10 may include Na, P, V, N, As, K, Li, or the like except for hydrogen. In other words, at the MOS interface, defects may not form interface traps having an energy level shallower than a conduction band end and may form interface traps having a deep energy level.

In this embodiment, the MOSFET in which the conductivity type of the well regions 3 is inverted from the second conductivity type to the first conductivity type, namely, the inverted MOSFET, is described, but this embodiment is also applicable to a storage MOSFET including a channel region of a first conductivity type provided beforehand in a region in which a channel of the well regions 3 is formed. For the storage MOSFET, the conductivity type of the channel is the first conductivity type beforehand, so that the threshold voltage is particularly decreased, and the normally-off characteristics are hardly achieved with good controllability. Thus, the application of this embodiment has the great effect, and increasing the threshold voltage allows the normally-off characteristics to be obtained with good controllability.

The channel region of the first conductivity type in the storage MOSFET may be formed by epitaxial growth or may be formed by ion implantation.

In this embodiment, the so-called planar MOSFET is described, but a trench MOSFET to which this embodiment is applied can obtain the same effects.

In this embodiment, the (0001) plane having the off-angle of 4° is used as the first main surface of the silicon carbide substrate 1, but a (11-20) plane or a (000-1) may be used. Furthermore, the off-angle is not limited to 4°.

This embodiment includes the so-called vertical semiconductor device in which ON-state current flows from the surface of the drift layer 2 formed on the first main surface of the silicon carbide substrate 1 to the back surface being the second main surface of the silicon carbide substrate 1, but this embodiment may include a so-called horizontal semiconductor device in which ON-state current flows from the surface of the drift layer 2 to the surface of the drift layer 2 in the horizontal direction.

In this embodiment, the silicon carbide MOSFET is described as an example, and it is needless to say that another semiconductor device having a gate insulating structure and including silicon carbide can obtain the same effects if this embodiment is applied thereto, the gate insulating structure including the gate insulating film 5 formed on silicon carbide.

Second Embodiment

FIG. 21 is an enlarged cross-sectional view around a MOS interface of a silicon carbide semiconductor device in a second embodiment. In this embodiment, a gate insulating film 5 includes nitrogen atoms. This embodiment is the same as the first embodiment except for this. This embodiment can further increase a threshold voltage.

Nitriding receives attention, the nitriding performing a heat treatment on the gate insulating film 5 in an atmosphere of a nitrogen gas such as a nitrogen monoxide (NO) gas and a dinitrogen monoxide ($N_2O$) gas for the purpose of increasing channel mobility of the MOSFET including silicon carbide. The nitriding makes inert interface traps due to surplus C at the MOS surface and increases the channel mobility.

In this embodiment, after the gate insulating film 5 in FIG. 10 in the first embodiment is formed, the silicon carbide substrate 1 having the structure in FIG. 10 is transferred into a nitriding furnace prior to reoxidation. The temperature in the nitriding furnace is increased in the atmosphere of the inert gas, which is switched to the atmosphere of nitrogen monoxide gas or dinitrogen monoxide gas when the temperature reaches the processing temperature, and the atmosphere of the nitriding gas and the processing temperature are maintained for a predetermined period of time to perform the nitriding.

Nitrogen monoxide gas or dinitrogen monoxide gas diluted with an inert gas such as nitrogen, argon, helium, and krypton may also be used for an atmosphere during the nitriding in the nitriding reactor, and an atmosphere of a mixture of the nitrogen monoxide gas and the dinitrogen monoxide gas may be used.

The nitriding temperatures are preferably 900° C. or higher and 1450° C. or lower. The reason is that nitriding speed at low temperatures of less than 900° C. is extremely slow and the interface traps at the MOS interface are hardly developed to be inert by nitrogen atoms. Moreover, the reason is that the thermal oxidation of silicon carbide by oxygen generated by decomposition of the nitrogen monoxide gas or the dinitrogen monoxide gas progresses under high temperature conditions of 1450° C. or higher, and interface traps are newly increased at the MOS interface.

Moreover, nitriding time preferably ranges from approximately 10 minutes to 10 hours.

After the nitriding, the atmosphere in the reactor is switched to the atmosphere of the inert gas, the temperature drops to a takeout temperature, and the silicon carbide substrate 1 is taken out of the reactor. The nitriding step is thus ended.

After the nitriding step is ended, the reoxidation described in the first embodiment is performed.

The nitriding makes the inert interface traps by nitrogen atoms, the interface traps having a shallow energy level such as C=C at the MOS interface. The channel mobility is increased by a decrease in a density of the interface traps having the shallow level, but the threshold voltage also decreases, resulting in the normally-on characteristics.

The first traps formed by the defects 10 including the bond between silicon and hydrogen described in the first embodiment can achieve the normally-off characteristics even if the nitriding is performed.

The nitriding is performed at relatively high temperatures of 900° C. or higher and 1450° C. or lower. In the heat treatment at the high temperature, oxygen atoms are desorbed from the gate insulating film 5, and thus oxygen vacancies are easily generated. The oxygen vacancies are positively charged, so that the threshold voltage of the MOSFET is reduced as the oxygen vacancies increase. In other words, performing the nitriding reduces the threshold voltage.

FIG. 22 schematically shows a relationship between channel mobility and a threshold voltage in this embodiment. In the diagram, a conventional example in which reoxidation and nitriding are not performed is indicated by an alternate long and short dashed line, and the conventional example indicated by the alternate long and short dashed line in which only reoxidation is performed is indicated by a dotted line. The dotted line corresponds to the first embodiment, which can achieve the increase in the threshold voltage compared to the conventional example.

In the diagram, the conventional example indicated by the alternate long and short dashed line in which only nitriding is performed is indicated by a solid line, and the example in which both nitriding and reoxidation are performed is indicated by a chain double-dashed line. When the alternate long and short dashed line are compared to the solid line, the solid line is shifted to the high channel mobility side and the low threshold voltage side by performing the nitriding. The reason is that oxygen vacancies positively charged are increased in addition to the effect of reducing the interface traps.

After the nitriding, more defects 10 including the bond between silicon and hydrogen shown in FIG. 3 are formed by the amount of oxygen vacancies in the chain double-dashed line in which the reoxidation is performed. In other words, more first traps or more negative fixed charges in the gate insulating film 5 are generated, so that the increment of the threshold voltage can be increased, and the higher threshold voltage in higher channel mobility can be achieved.

The nitriding excessively generate nitrogen atoms also in the gate insulating film 5, and the nitrogen atoms are positively charged and become positive fixed charges, thereby reducing the threshold voltage. In the reoxidation step, the nitrogen atoms react with OH⁻ to form NO, and the effect of emitting NO to the outside of the gate insulating film 5 can be obtained. This reduces the positive fixed charges increased by the nitriding, thereby contributing to the realization of the high threshold voltage.

In addition, differences between the first embodiment and the second embodiment are described in the second embodiment of the present invention, and descriptions of the same or corresponding components are omitted.

DESCRIPTION OF NUMERALS

1 silicon carbide substrate; 2 drift layer; 3 base region; 4 source region; 5 gate insulating film; 6 gate electrode; 7 source electrode; 8 drain electrode; 10 defect including a bond between silicon and hydrogen.

The invention claimed is:
1. A silicon carbide semiconductor device, comprising:
a drift layer of a first conductivity type formed on a surface of a silicon carbide substrate;
a plurality of well regions of a second conductivity type formed at an interval in a surface layer portion of the drift layer;
a source region of the first conductivity type formed in part of a surface layer portion of the well regions;
a gate insulating film formed on surfaces of the well regions and the source region; and
a gate electrode formed on a surface of the gate insulating film so as to be opposite to an end portion of the source region and the well regions, wherein
a coefficient X [eV] in which an energy level of interface traps is in a range of 0.1 eV to 0.4 eV is 0.09 eV or more and 0.13 eV or less in Math 1

$$D_{it}(E) = A + B\exp\left(-\frac{E_c - E}{X}\right) \quad \text{[Math 1]}$$

where a density of the interface traps formed in an interface region between the gate insulating film and the well regions is $D_{it}$ [cm$^{-2}$eV$^{-1}$], an energy level of the interface traps at a depth from an energy level $E_c$ of a conduction band of silicon carbide is ($E_c$-E) [eV], an asymptotic value of a density $D_{it}$ of the interface traps having an energy level of ∞ [eV] is a coefficient A [cm$^{-2}$eV$^{-1}$], a coefficient B [cm$^{-2}$eV$^{-1}$] is a value in which a density $D_{it}$ of the interface traps having an energy level of 0 [eV] is equal to (A+B) [cm$^{-2}$eV$^{-1}$], and X [eV] is a coefficient, and a ratio R is 0.54 or more and 0.67 or less in Math 2

$$R = \frac{D_{it}2}{D_{it}8} \quad \text{[Math 2]}$$

where a density of the interface traps when an energy level of the interface traps is 0.1 eV is a reference value $D_{it}1$ [cm$^{-2}$eV$^{-1}$], a difference between a density of the interface traps when an energy level of the interface traps is 0.2 eV and $D_{it}1$ [cm$^{-2}$eV$^{-1}$] is $D_{it}2$ [cm$^{-2}$eV$^{-1}$], a difference between a density of the interface traps when an energy level of the interface traps is 0.8 eV and $D_{it}1$ [cm$^{-2}$eV$^{-1}$] is $D_{it}8$ [cm$^{-2}$eV$^{-1}$], and a ratio of $D_{it}2$ [cm$^{-2}$eV$^{-1}$] to $D_{it}8$ [cm$^{-2}$eV$^{-1}$] is the ratio R.

2. The silicon carbide semiconductor device according to claim 1, wherein
the gate insulating film has defects comprising a bond between silicon and hydrogen in the interface region between the well regions and the gate insulating film, and
the interface traps comprise a first trap that is formed by each of the defects and has an energy level deeper than a conduction band end of silicon carbide.

3. The silicon carbide semiconductor device according to claim 2, wherein the first trap has an energy level at a depth of 0.6 eV or more and 1.5 eV or less from the conduction band end of silicon carbide.

4. The silicon carbide semiconductor device according to claim 1, wherein the gate insulating film further has a second trap therein, the second trap is formed by each of defects comprising a bond between silicon and hydrogen.

5. The silicon carbide semiconductor device according to claim 1, wherein the gate insulating film contains nitrogen atoms in the interface region between the well regions and the gate insulating film.

6. The silicon carbide semiconductor device according to claim 1, wherein the gate insulating film comprises a SiO$_2$ film.

7. The silicon carbide semiconductor device according to claim 1, wherein the well regions include a channel region of the first conductivity type in a region in which a channel is formed.

8. A silicon carbide semiconductor device, comprising:
a drift layer of a first conductivity type formed on a surface of a silicon carbide substrate;
a plurality of well regions of a second conductivity type formed at an interval in a surface layer portion of the drift layer;
a source region of the first conductivity type formed in part of a surface layer portion of the well regions;
a gate insulating film formed on surfaces of the well regions and the source region; and
a gate electrode formed on a surface of the gate insulating film so as to be opposite to an end portion of the source region and the well regions, wherein
a ratio R is 0.54 or more and 0.67 or less in Math 2

$$R = \frac{D_{it}2}{D_{it}8} \quad \text{[Math 2]}$$

where of interface traps formed in an interface region between the gate insulating film and the well regions, a density of the interface traps when an energy level from a conduction band end of silicon carbide is 0.1 eV is a reference value $D_{it}1$ [cm$^{-2}$eV$^{-1}$], a difference between a density of the interface traps when an energy level from the conduction band end is 0.2 eV and $D_{it}1$ [cm$^{-2}$eV$^{-1}$] is $D_{it}2$ [cm$^{-2}$eV$^{-1}$], a difference between a density of the interface traps when an energy level from the conduction band end is 0.8 eV and $D_{it}1$ [cm$^{-2}$eV$^{-1}$] is $D_{it}8$ [cm$^{-2}$eV$^{-1}$], and a ratio of $D_{it}2$ [cm$^{-2}$eV$^{-1}$] to $D_{it}8$ [cm$^{-2}$eV$^{-1}$] is the ratio R,
the gate insulating film has defects comprising a bond between silicon and hydrogen in the interface region between the well regions and the gate insulating film, and
the interface traps comprise a first trap that is formed by each of the defects and has an energy level at a depth of 0.6 eV or more and 1.5 eV or less from the conduction band end.

9. The silicon carbide semiconductor device according to claim 8, wherein the gate insulating film further has a second trap therein, the second trap is formed by each of defects comprising a bond between silicon and hydrogen.

10. The silicon carbide semiconductor device according to claim 8, wherein the gate insulating film contains nitrogen atoms in the interface region between the well regions and the gate insulating film.

11. The silicon carbide semiconductor device according to claim 8, wherein the gate insulating film comprises a SiO$_2$ film.

12. The silicon carbide semiconductor device according to claim 8, wherein the well regions include a channel region of the first conductivity type in a region in which a channel is formed.

13. A silicon carbide semiconductor device, comprising:
a drift layer of a first conductivity type formed on a surface of a silicon carbide substrate;
a plurality of well regions of a second conductivity type formed at an interval in a surface layer portion of the drift layer;
a source region of the first conductivity type formed in part of a surface layer portion of the well regions;
a gate insulating film formed on surfaces of the well regions and the source region; and
a gate electrode formed on a surface of the gate insulating film so as to be opposite to an end portion of the source region and the well regions, wherein
of interface traps formed in an interface region between the gate insulating film and the well regions, a density of the interface traps when an energy level from a conduction band end of silicon carbide is 0.8 eV is 1×10$^{11}$ cm$^{-2}$eV$^{-1}$ or more, the gate insulating film has defects comprising a bond between silicon and hydrogen in the interface region between the well regions and the gate insulating film, and the interface traps comprise a first trap that is formed by each of the defects and has an energy level at a depth of 0.6 eV or more and 1.5 eV or less from the conduction band end.

14. The silicon carbide semiconductor device according to claim 13, wherein the gate insulating film further has a second trap therein, the second trap is formed by each of defects comprising a bond between silicon and hydrogen.

15. The silicon carbide semiconductor device according to claim 13, wherein the gate insulating film contains nitrogen atoms in the interface region between the well regions and the gate insulating film.

16. The silicon carbide semiconductor device according to claim 13, wherein the gate insulating film comprises a $SiO_2$ film.

17. The silicon carbide semiconductor device according to claim 13, wherein the well regions include a channel region of the first conductivity type in a region in which a channel is formed.

* * * * *